US008845403B2

(12) United States Patent
Archibald et al.

(10) Patent No.: US 8,845,403 B2
(45) Date of Patent: Sep. 30, 2014

(54) INDIVIDUALLY COOLING ONE OR MORE COMPUTERS IN A RACK OF COMPUTERS IN A DATA CENTER

(75) Inventors: Matthew R. Archibald, Durham, NC (US); Jerrod K. Buterbaugh, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 1148 days.

(21) Appl. No.: 12/781,915

(22) Filed: May 18, 2010

(65) Prior Publication Data
US 2011/0288664 A1 Nov. 24, 2011

(51) Int. Cl.
G06F 1/20 (2006.01)
H05K 7/20 (2006.01)

(52) U.S. Cl.
CPC ........ *H05K 7/20745* (2013.01); *H05K 7/20736* (2013.01); *G06F 1/206* (2013.01)
USPC .......................................... 454/184; 454/232

(58) Field of Classification Search
CPC ........ G06F 1/20; G06F 1/206; H05K 7/20736
USPC ................................................. 454/184, 232
See application file for complete search history.

(56) References Cited

U.S. PATENT DOCUMENTS 3,065,686 A * 11/1962 Geocaris ...................... 454/248
3,318,225 A    5/1967 May
4,158,875 A    6/1979 Tajima et al.
4,335,647 A    6/1982 Timmons
4,531,454 A *  7/1985 Spoormaker ................. 454/232
4,775,001 A   10/1988 Ward et al.
5,345,779 A    9/1994 Feeney (Continued)

FOREIGN PATENT DOCUMENTS

| CN | 101173817 A | 5/2008 |
| CN | 101437385 A | 5/2009 |
| CN | 100533343 C | 8/2009 |
| CN | 201319718 Y | 9/2009 |

OTHER PUBLICATIONS

IBM, "Automatic Opening Floor Tile for Back-up Air Cooling of Server Racks", IP.Com Prior Art Database, Jul. 18, 2005, pp. 1-5, IP.com No. IPCOM000126445D, IP.com.

(Continued)

*Primary Examiner* — Steven B McAllister
*Assistant Examiner* — Ko-Wei Lin
(74) *Attorney, Agent, or Firm* — Edward J. Lenart; Katherine S. Brown; Biggers Kennedy Lenart Spraggins LLP

(57) ABSTRACT

Individually cooling one or more computers in a rack of computers in a data center including an air intake chamber, the air intake chamber having a first opening at a bottom end for receiving air from beneath the data center through perforated tiles in the floor of the data center and a plurality of openings at a top end for providing air into a plurality of flexible air channels; and a plurality of flexible air channels, each air channel having a first end opening into the air intake chamber and having an opening at a second end and having a connector to connect the second end of the flexible air chamber to a particular position in the rack corresponding to the location of a particular computer in the rack.

6 Claims, 4 Drawing Sheets

(56) References Cited

U.S. PATENT DOCUMENTS

| | | | |
|---|---|---|---|
| 5,769,702 A * | 6/1998 | Hanson | 454/63 |
| 5,995,368 A | 11/1999 | Lee et al. | |
| 6,183,359 B1 | 2/2001 | Klein et al. | |
| 6,193,601 B1 | 2/2001 | Torczynski | |
| 6,222,729 B1 | 4/2001 | Yoshikawa | |
| 6,318,113 B1 * | 11/2001 | Levy et al. | 62/426 |
| 6,328,776 B1 * | 12/2001 | Shanks et al. | 55/385.2 |
| 6,402,613 B1 * | 6/2002 | Teagle | 454/195 |
| 6,491,578 B2 * | 12/2002 | Yoshinori et al. | 454/139 |
| 6,526,702 B2 | 3/2003 | Jones | |
| 6,557,357 B2 | 5/2003 | Spinazzola et al. | |
| 6,574,104 B2 | 6/2003 | Patel et al. | |
| 6,574,970 B2 | 6/2003 | Spinazzola et al. | |
| 6,616,524 B2 | 9/2003 | Storck, Jr. et al. | |
| 6,648,752 B2 | 11/2003 | Vernier et al. | |
| 6,672,955 B2 | 1/2004 | Charron | |
| 6,694,759 B1 | 2/2004 | Bash et al. | |
| 6,747,872 B1 | 6/2004 | Patel et al. | |
| 6,819,563 B1 | 11/2004 | Chu et al. | |
| 6,826,456 B1 | 11/2004 | Irving et al. | |
| 6,862,179 B2 | 3/2005 | Beitelmal et al. | |
| 6,882,531 B2 | 4/2005 | Modica | |
| 6,957,544 B2 | 10/2005 | Dobbs et al. | |
| 7,050,300 B2 | 5/2006 | Hein | |
| 7,074,123 B2 | 7/2006 | Bettridge et al. | |
| 7,170,745 B2 | 1/2007 | Bash et al. | |
| 7,214,131 B2 | 5/2007 | Malone | |
| 7,251,547 B2 | 7/2007 | Bash et al. | |
| 7,259,963 B2 | 8/2007 | Germagian et al. | |
| 7,266,964 B2 | 9/2007 | Vogel et al. | |
| 7,347,058 B2 | 3/2008 | Malone et al. | |
| 7,361,081 B2 * | 4/2008 | Beitelmal et al. | 454/184 |
| 7,379,298 B2 | 5/2008 | Walsh et al. | |
| 7,486,511 B1 | 2/2009 | Griffel et al. | |
| 7,568,360 B1 | 8/2009 | Bash et al. | |
| 7,643,291 B2 | 1/2010 | Mallia et al. | |
| 7,656,660 B2 | 2/2010 | Hoeft et al. | |
| 7,862,410 B2 | 1/2011 | McMahan et al. | |
| 7,869,210 B2 * | 1/2011 | Moss | 361/694 |
| 7,878,889 B2 * | 2/2011 | Day | 454/184 |
| 7,903,407 B2 | 3/2011 | Matsushima et al. | |
| 7,907,402 B2 | 3/2011 | Caveney | |
| 7,957,139 B2 | 6/2011 | Davis et al. | |
| 7,986,526 B1 | 7/2011 | Howard et al. | |
| 8,054,625 B2 * | 11/2011 | Noteboom et al. | 361/688 |
| 8,175,753 B2 | 5/2012 | Sawczak et al. | |
| 2003/0067745 A1 | 4/2003 | Patel et al. | |
| 2005/0159099 A1 | 7/2005 | Malone | |
| 2005/0237716 A1 * | 10/2005 | Chu et al. | 361/696 |
| 2006/0199508 A1 | 9/2006 | Nair et al. | |
| 2006/0260338 A1 | 11/2006 | VanGilder et al. | |
| 2007/0167125 A1 * | 7/2007 | Rasmussen et al. | 454/184 |
| 2007/0171610 A1 | 7/2007 | Lewis | |
| 2007/0173189 A1 | 7/2007 | Lewis | |
| 2008/0204999 A1 | 8/2008 | Clidaras et al. | |
| 2008/0269932 A1 | 10/2008 | Chardon et al. | |
| 2008/0285232 A1 | 11/2008 | Claassen et al. | |
| 2009/0012633 A1 | 1/2009 | Liu et al. | |
| 2009/0031896 A1 | 2/2009 | Abraham et al. | |
| 2009/0059523 A1 | 3/2009 | Mallia et al. | |
| 2009/0061755 A1 | 3/2009 | Calder et al. | |
| 2009/0107652 A1 | 4/2009 | VanGilder et al. | |
| 2009/0156114 A1 | 6/2009 | Ahladas et al. | |
| 2009/0173017 A1 | 7/2009 | Hall | |
| 2009/0277605 A1 | 11/2009 | VanGilder et al. | |
| 2009/0305625 A1 | 12/2009 | Dawson et al. | |
| 2010/0027216 A1 | 2/2010 | Matsushima et al. | |
| 2010/0035535 A1 | 2/2010 | Taylor | |
| 2010/0041327 A1 | 2/2010 | Desler | |
| 2010/0064610 A1 | 3/2010 | Kulkarni et al. | |
| 2010/0067745 A1 | 3/2010 | Kovtun et al. | |
| 2010/0126696 A1 | 5/2010 | Novotny et al. | |
| 2010/0151781 A1 | 6/2010 | Slessman et al. | |
| 2010/0263830 A1 * | 10/2010 | Noteboom et al. | 165/80.2 |
| 2011/0189936 A1 | 8/2011 | Haspers et al. | |
| 2011/0288664 A1 | 11/2011 | Archibald et al. | |
| 2012/0020009 A1 | 1/2012 | Archibald et al. | |
| 2012/0033368 A1 | 2/2012 | Archibald et al. | |
| 2012/0035781 A1 | 2/2012 | Archibald et al. | |
| 2012/0072195 A1 | 3/2012 | Archibald et al. | |
| 2012/0243173 A1 | 9/2012 | Archibald et al. | |
| 2013/0178144 A1 | 7/2013 | Archibald et al. | |
| 2013/0200764 A1 | 8/2013 | Archibald et al. | |

OTHER PUBLICATIONS

IBM, "Dynamic Thermal Mapping and Trend Analysis As a Control Mechanism for HVAC Systems in Data Centers," IP.Com Prior Art Database, Mar. 27, 2006, pp. 1-3, IP.com No. IPCOM000135036D, IP.com.

Disclosed Anonymously, "Method for a Managed Airflow Server Cabinet", IP.Com Prior Art Database, Apr. 26, 2006, pp. 1-7, IP.com No. IPCOM000135845D, IP.com.

IBM, "Apparatus and Method for Measuring Volumetric Airflow Rates for a BlueGene Rack or Rack Assembly with Vertical Airflow", IP.Com Prior Art Database, Jun. 18, 2008, pp. 1-9, IP.com No. IPCOM000171776D, IP.com.

IBM, "The Cooling Control System of Server", IP.Com Prior Art Database, Dec. 29, 2009, pp. 1-4, IP.com No. IPCOM000191308D, IP.com.

El-Hakim, S.F., et al., "Sensor Based Creation of Indoor Virtual Environment Models", Proceedings of the 1997 International Conference on Virtual Systems and MultiMedia, VSMM '97, Sep. 10-12, 1997, pp. 50-58, IEEE Computer Society, Washington, DC, USA. DOI: 10.1109/VSMM.1997.622327.

Office Action, U.S. Appl. No. 12/851,992, Feb. 21, 2012.
Notice of Allowance, U.S. Appl. No. 12/851,992, May 9, 2012.
Office Action, U.S. Appl. No. 12/840,863, Jan. 26, 2012.
Notice of Allowance, U.S. Appl. No. 12/840,863, Mar. 22, 2012.
Office Action, U.S. Appl. No. 12/781,915, Apr. 26, 2013.
Final Office Action, U.S. Appl. No. 12/781,915, Oct. 24, 2013.
Final Office Action, U.S. Appl. No. 12/852,091, Apr. 23, 2013.
Notice of Allowance, U.S. Appl. No. 12/852,091, Aug. 21, 2013.
Office Action, U.S. Appl. No. 12/852,091, Nov. 26, 2012.
Final Office Action, U.S. Appl. No. 12/885,456, Sep. 10, 2013.
Office Action, U.S. Appl. No. 12/885,456, Mar. 19, 2013.

* cited by examiner

INDIVIDUALLY COOLING ONE OR MORE COMPUTERS IN A RACK OF COMPUTERS IN A DATA CENTER

BACKGROUND OF THE INVENTION

1. Field of the Invention

The field of the invention is individually cooling computers in a rack of computers in a data center.

2. Description of Related Art

Typical data centers have floor tiles that are perforated. Cooled air is blown up from air conditioner beneath the data center through the perforated tiles in the floor to cool the racks. The individual racks may or may not have as many servers installed as the rack can support and the installed servers may not be evenly distributed across the chassis of the rack.

SUMMARY OF THE INVENTION

Individually cooling one or more computers in a rack of computers in a data center including an air intake chamber, the air intake chamber having a first opening at a bottom end for receiving air from beneath the data center through perforated tiles in the floor of the data center and a plurality of openings at a top end for providing air into a plurality of flexible air channels; and a plurality of flexible air channels, each air channel having a first end opening into the air intake chamber and having an opening at a second end and having a connector to connect the second end of the flexible air chamber to a particular position in the rack corresponding to the location of a particular computer in the rack.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
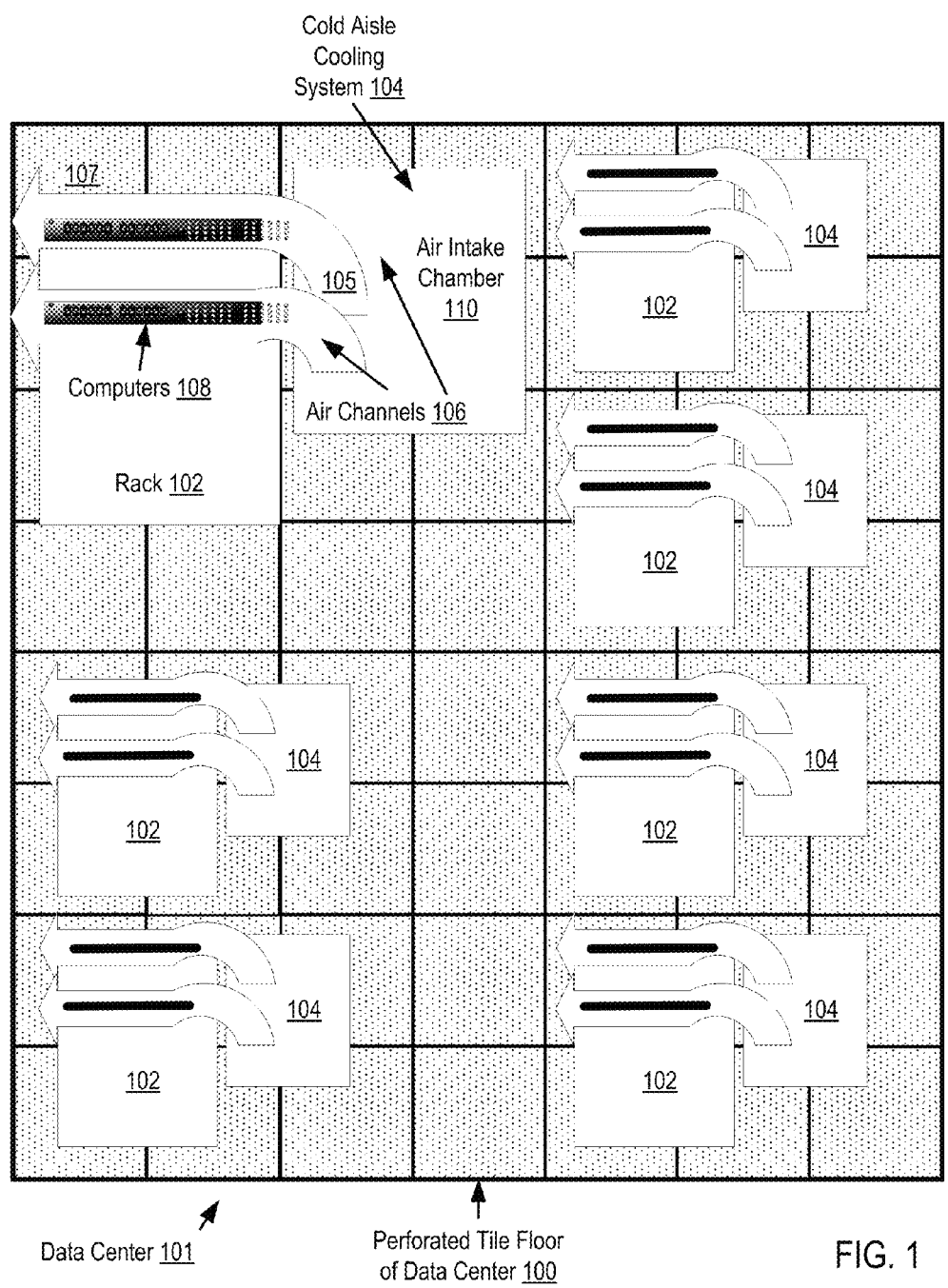
FIG. 1 sets forth a block diagram of an aerial view of a data center including a system for individually cooling one or more computers in a rack of computers in a data center according to embodiments of the present invention.

Exemplary systems and methods for individually cooling one or more computers in a rack of computers in a data center in accordance with the present invention are described with reference to the accompanying drawings, beginning with FIG. 1. FIG. 1 sets forth a block diagram of an aerial view of a data center including a system for individually cooling one or more computers in a rack of computers in a data center according to embodiments of the present invention. A data center is a facility used to house computer systems and associated components, such as telecommunications and storage systems. Data centers typically also include redundant or backup power supplies, redundant data communications connections, and environmental controls such as air conditioning, fire suppression, and security devices.

The data center (101) of FIG. 1 includes a number of racks (102) of computers (108). Racks of computers whose individual computers may be cooled according to embodiments of the present invention may include for example blade environments including chassis of blade servers, server racks and others as will occur to those of skill in the art.

The data center (101) of FIG. 1 also has a perforated tile floor (100) beneath which is installed an air conditioning system. Cooled air is blown from beneath the perforated tile floor to cool the racks (102) of computers (108) of the data center.

In the data center (101) of FIG. 1, each rack (102) is cooled with a cold aisle cooling system (104) according to embodiments of the present invention. The cold aisle cooling system (104) includes an air intake chamber (110). The air intake chamber (110) has a first opening at a bottom end for receiving air from beneath the data center through perforated tiles in the floor of the data center and a plurality of openings at a top end for providing air into a plurality of flexible air channels (106). Air intake chambers in accordance with the present invention may be sized and shaped in a number of ways consistent with their specific use in a particular data center as will occur to those of skill in the art. For example, an air intake chamber may have a size and shape that conforms to the size and shape of one or more perforated tiles of the floor of the data center, the air intake chamber may be sized to in relation to the number of flexible air channels receiving air from the intake chamber and directing air to individual computers of the rack, and so on as will occur to those of skill in the art. In some embodiments of the present invention, the air intake chamber includes one or more connectors to secure the air intake chamber to the floor of the data center thereby preventing the air intake chamber from moving and providing stability to the cold aisle cooling system.

The cold aisle cooling system (104) of FIG. 1 also includes a plurality of flexible air channels (106). Each air channel having a first end (105) opening into the air intake chamber (110) and having an opening at a second end (107) and having a connector to connect the second end of the flexible air chamber to a particular position in the rack corresponding to the location of a particular computer in the rack. In the example of FIG. 1 each flexible air channel is connected to the rack in front of a particular computer thereby providing individual cooling to that computer.

In the example of FIG. 1, each cold aisle cooling system (104) includes only two flexible air channels and two computers. This is for ease of explanation, and not for limitation. In fact, cold aisle cooling system (104) according to embodiments of the present invention may include any number of flexible air channels and the number will often correspond to the configuration and number of computers in the racks they are designed to support.

In some embodiments of the present invention the flexible air channels are implemented as flexible accordion tubes. Such flexible accordion tubes may be made of plastic or other material as will occur to those of skill in the art. Furthermore, in some embodiments of the present invention the opening of the second end of the flexible air channels is shaped to conform to the profile of a computer in the rack. Such an opening may be designed to conform to the size and shape of the computer in the rack, the width of the rack itself, or other features as will occur to those of skill in the art.

In the example of FIG. 1, the second end (107) of the flexible air channel is connected to the front of the rack. In such cases, cool air is directed to the front of the computer and blown across the computer exiting in the back of the rack. In alternative embodiments, the flexible air channel may be connected to the back of the rack or the side of the rack such that air is more particularly directed to particular computers, or in any other manner as will occur to those of skill in the art.

In some embodiments of the present invention, the flexible air channels reside within an exterior chassis. In such cases, the flexible air channels are protected from disruption by systems administrators working in the data center.

In the example of FIG. 1, the cold aisle cooling system (104) is external to the rack (102). In some embodiments of the present invention, however, the air intake chamber and the flexible air channels reside within the chassis of the rack of computers themselves. That is, in some embodiments the cold aisle cooling system (104) is integrated into the rack itself.

The arrangement of servers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
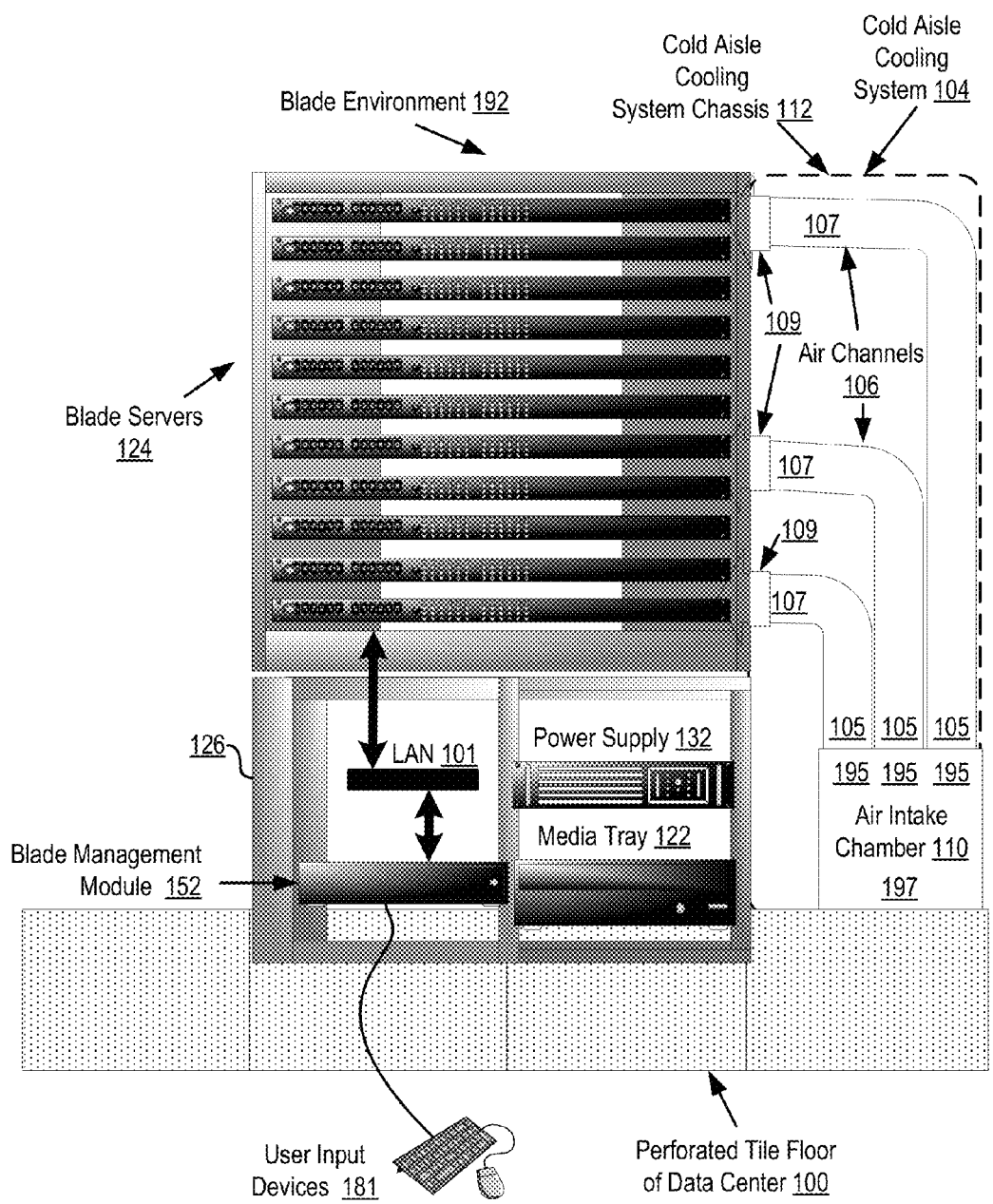
FIG. 2 sets forth a diagram of a system for individually cooling one or more computers in a rack of computers in a data center according to embodiments of the present invention.

For further explanation, FIG. 2 sets forth a diagram of a system for individually cooling one or more computers in a rack of computers in a data center according to embodiments of the present invention. The example of FIG. 2 includes a blade environment (192). 'Blade environment,' as the term is used in this specification, refers generally to a blade server system installed in this example in a two-bay chassis (126) and including a number of blade servers (124), one or more blade management modules (152), a media tray (122), and a blade server system power supply (132).

The blade management module (152) is a small computer in its own right, including software and hardware components, one or more computer processors and computer memory, that provides system management functions for all components in the example blade environment (192) including the blade servers (124) and the media tray (122). The blade management module of FIG. 2 also makes available connections for user input devices such as mice or keyboards (181) that are not generally connected directly to the blade servers or to the blade environment chassis. The blade servers themselves (124), installed in a cabinet bay (126) of the exemplary blade environment (192) in the example of FIG. 2, are several computing devices implemented in blade form factor. The blade servers share access to the media tray (122). The blade servers (124) are connected to one another and to the blade management module (152) for data communications through a local area network ('LAN') (101). The LAN (101) is a small network installed within the chassis of the blade environment.

The media tray (122) houses non-volatile memory media generally. A media tray may typically include Compact Disc read-only media drives ('CD-ROM'), Digital Video Disc ROM drives (DVD-ROM), CD-RW drives, DVD-RW drives, floppy disk drives, and so on as will occur those of skill in the art. The example of FIG. 2 includes a cold aisle cooling system (104) for individually cooling one or more computers (124) in the blade environment (192). The cold aisle cooling system (104) includes an air intake chamber (110). The air intake chamber (110) of FIG. 2 has a first opening (197) at a bottom end for receiving air from beneath the data center through perforated tiles (100) in the floor of the data center and a plurality of openings (195) at a top end for providing air into a plurality of flexible air channels (106).

The cold aisle cooling system (104) in the example of FIG. 2 includes a plurality of flexible air channels (106). Each air channel (106) having a first end opening (105) into the air intake chamber (110) and having an opening at a second end (107) and having a connector (109) to connect the second end (107) of the flexible air chamber to a particular position in the chassis of the blade environment corresponding to a location of a particular computer in the rack. In the example of FIG. 2 the flexible air channels are implemented as flexible accordion tubes and the opening of the second end (107) of the flexible air channels (106) are shaped to conform to the profiles of the blade servers (124) in the blade environment (192). In the example of FIG. 2, second end (107) of the flexible air channels (106) are connected to the front of the chassis of the blade environment.

The arrangement of the blade environment (192), network (101), and other devices making up the exemplary system illustrated in FIG. 2 are for explanation, not for limitation. Data processing systems useful according to various embodiments of the present invention for individually cooling one or more computers in a rack of computers in a data center may include additional servers, routers, and other devices, not shown in FIG. 2, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 2.

Figure 3:
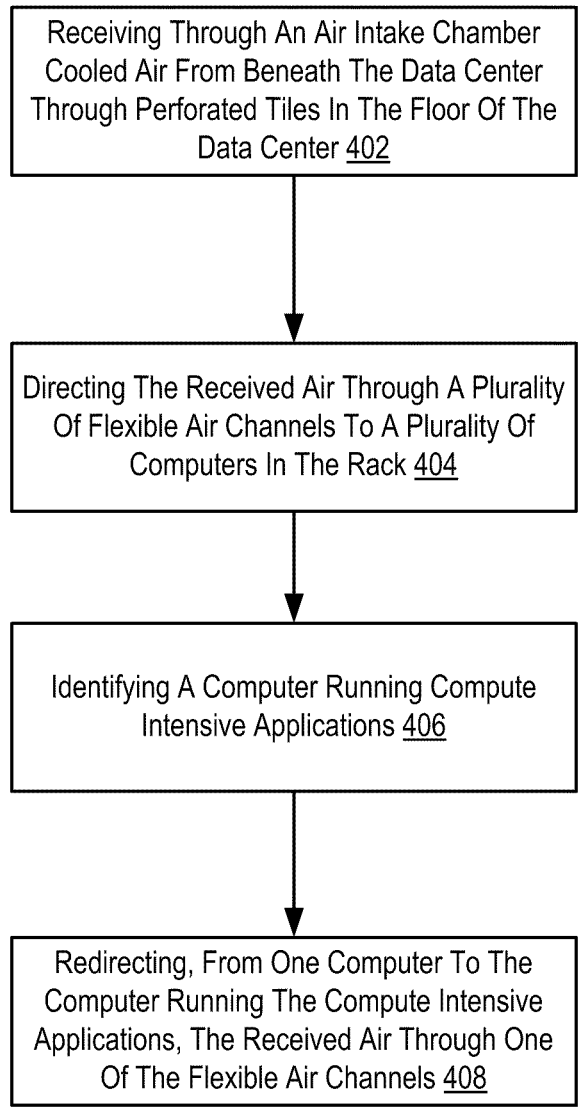
FIG. 3 sets forth a flow chart illustrating an exemplary method for individually cooling one or more computers in a rack of computers in a data center according to embodiments of the present invention.

For further explanation, FIG. 3 sets forth a flow chart illustrating an exemplary method for individually cooling one or more computers in a rack of computers in a data center according to embodiments of the present invention. The method of FIG. 3 includes receiving (402) through an air intake chamber cooled air from beneath the data center through perforated tiles in the floor of the data center. As mentioned above, such an air intake chamber may be secured to the floor and sized and shaped according to various factors as will occur to those of skill in the art.

The method of FIG. 3 also includes directing (404) the received air through a plurality of flexible air channels to a plurality of computers in the rack. Directing (404) the received air through a plurality of flexible air channels to a plurality of computers in the rack may include directing air to computers running compute intensive jobs. Directing (404) the received air through a plurality of flexible air channels to a plurality of computers in the rack may be carried out by securing the flexible air channels to the rack in particular positions to cool particular computers.

The method of FIG. 3 also includes identifying a computer running compute intensive applications (406). Identifying a computer running compute intensive applications (406) may be carried out by identifying applications running on computers previously determined to be compute intensive, monitoring the metrics of the current operation of the processor and I/O functions of the computers and comparing those metrics to previously determined thresholds and in other ways as will occur to those of skill in the art.

The method of FIG. 3 also includes redirecting (408), from one computer to the computer running the compute intensive applications, the received air through one of the flexible air channels. Redirecting (408), from one computer to the computer running the compute intensive applications, the received air through one of the flexible air channels may be carried out by moving the flexible air channel to be connected in a new position on the rack for the computer running the compute intensive application. Redirecting (408), from one computer to the computer running the compute intensive applications, the received air through one of the flexible air channels may be carried out by a systems administrator physically moving the flexible air channels or by a mechanism for moving the flexible air channels to different positions on the rack.

Figure 4:
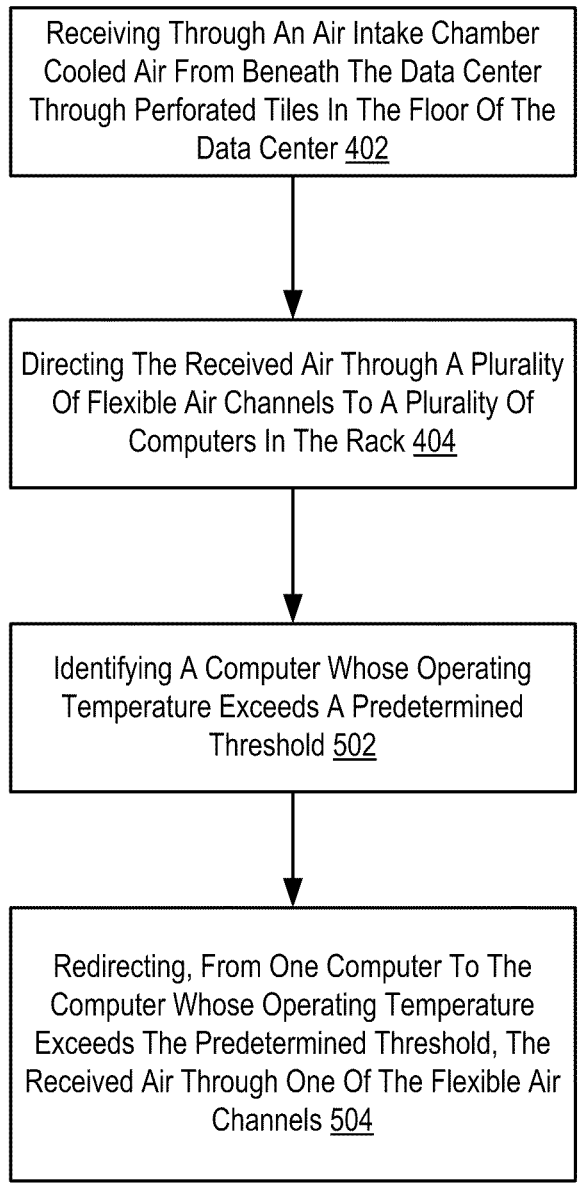
FIG. 4 sets forth a flow chart illustrating an exemplary method for individually cooling one or more computers in a rack of computers in a data center according to embodiments of the present invention.

For further explanation, FIG. 4 sets forth a flow chart illustrating an exemplary method for individually cooling one or more computers in a rack of computers in a data center according to embodiments of the present invention. The method of FIG. 4 is similar to the method of FIG. 3 in that the method of FIG. 4 includes receiving (402) through an air intake chamber cooled air from beneath the data center through perforated tiles in the floor of the data center and directing (404) the received air through a plurality of flexible air channels to a plurality of computers in the rack.

The method of FIG. 4 differs from the method of FIG. 3 in that the method of FIG. 4 includes identifying (502) a computer whose operating temperature exceeds a predetermined threshold. Identifying (502) a computer whose operating temperature exceeds a predetermined threshold may be carried out by determining the operating temperature of the computer and comparing that operating temperature with a predetermined threshold.

The method of FIG. 4 also includes redirecting (504), from one computer to the computer whose operating temperature exceeds the predetermined threshold, the received air through one of the flexible air channels. (504), from one computer to the computer whose operating temperature exceeds the predetermined threshold, the received air through one of the flexible air channels may be carried out by moving the flexible air channel to be connected in a new position on the rack for the computer whose operating temperature exceeds the predetermined threshold. Redirecting (504), from one computer to the computer whose operating temperature exceeds the predetermined threshold, the received air through one of the flexible air channels may be carried out by a systems administrator physically moving the flexible air channels or by a mechanism for moving the flexible air channels to different positions on the rack.

Exemplary embodiments of the present invention are described largely in the context of a fully functional system for individually cooling one or more computers in a rack of computers in a data center. Readers of skill in the art will recognize, however, that some aspects of the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A system for individually cooling one or more computers in a rack of computers in a data center, the system comprising:
    an air intake chamber, the air intake chamber having a first opening at a bottom end for receiving air from beneath the data center through perforated tiles in the floor of the data center and a plurality of openings at a top end for providing air into a plurality of flexible air channels; and
    the plurality of flexible air channels, each air channel having:
    a first end opening into the air intake chamber,
    an opening at a second end, and
    a connector connecting the second end of the flexible air channel to a particular position in the rack corresponding to the location of a particular computer in the rack so as to direct airflow to the particular computer;
    wherein the plurality of flexible air channels comprise flexible accordion tubes;
    wherein the opening of the second end of each of the plurality of flexible air channels is shaped to conform to the profile of a computer in the rack.

2. The system of claim 1 wherein the second end of each of the plurality of flexible air channels is connected to the front of the rack.

3. The system of claim 1 wherein the air intake chamber has a size and shape conforming in size and shape to one or more perforated tiles of the floor of the data center.

4. The system of claim 1 wherein the plurality of flexible air channels reside within an exterior chassis.

5. The system of claim 1 wherein the air intake chamber and the plurality of flexible air channels reside within the chassis of the rack of computers.

6. The system of claim 1 wherein the rack of computers comprises a blade environment including a chassis and a plurality of blade servers.

* * * * *